United States Patent [19]

Gupta et al.

[11] 4,383,129
[45] May 10, 1983

[54] SOLAR CELL ENCAPSULATION

[75] Inventors: Amitava Gupta, Pasadena; John D. Ingham; Andre H. Yavrouian, both of La Crescenta, all of Calif.

[73] Assignee: California Institute of Technology, Pasadena, Calif.

[21] Appl. No.: 380,525

[22] Filed: May 21, 1982

Related U.S. Application Data

[62] Division of Ser. No. 158,575, Jun. 11, 1980.

[51] Int. Cl.³ ............................................. H01L 31/04
[52] U.S. Cl. ...................................... 136/251; 136/259; 427/385.5; 427/407.1; 156/324.4; 156/332
[58] Field of Search ................................ 136/251, 259

[56] References Cited

U.S. PATENT DOCUMENTS

| 3,957,537 | 5/1976 | Baskett | 136/251 |
|---|---|---|---|
| 4,067,764 | 1/1978 | Walker et al. | 156/267 |
| 4,093,473 | 6/1978 | Lindmayer | 136/251 |
| 4,147,560 | 4/1979 | Gochermann | 136/251 |
| 4,210,462 | 7/1980 | Tourneux | 136/251 |
| 4,224,081 | 9/1980 | Kawamura et al. | 136/251 |
| 4,249,958 | 2/1981 | Baudin et al. | 136/251 |
| 4,287,382 | 9/1981 | French | 136/244 |
| 4,321,418 | 3/1982 | Dran et al. | 136/251 |
| 4,322,261 | 3/1982 | DuBois | 156/280 |
| 4,331,494 | 5/1982 | Duchateau et al. | 156/87 |

OTHER PUBLICATIONS

W. Carroll et al., "Material & Design Considerations of Encapsulants for Photovoltaic Arrays in Terrestrial Applications," *Conf. Record, 12th IEEE Photovoltaic Specialists Conf.* (1976), pp. 332-339.
E. F. Cuddihy et al., "Low-Cost Encapsulation Materials for Terrestrial Solar Cell Modules," *Solar Energy*, vol. 22, pp. 389-396 (1979).
D. C. Carmichael et al., "Materials for Encapsulation Systems for Terrestrial Photovoltaic Arrays," *Conf. Record, 12th IEEE Photovoltaic Specialists Conf.* (1976), pp. 317-331.

Primary Examiner—Aaron Weisstuch
Attorney, Agent, or Firm—Marvin E. Jacobs

[57] ABSTRACT

A polymer syrup for encapsulating solar cell assemblies. The syrup includes uncrosslinked poly(n-butyl)acrylate dissolved in n-butyl acrylate monomer. Preparation of the poly(n-butyl)acrylate and preparation of the polymer syrup is disclosed.

Methods for applying the polymer syrup to solar cell assemblies as an encapsulating pottant are described. Also included is a method for solar cell construction utilizing the polymer syrup as a dual purpose adhesive and encapsulating material.

3 Claims, 4 Drawing Figures

SOLAR CELL ENCAPSULATION

ORIGIN OF THE INVENTION

The invention described herein was made in the performance of work under a NASA Contract and is subject to the provisions of Sections 305 of the National Aeronautics and Space Act of 1958, public law 83-568 (72 Statute 435; 42 U.S.C. 2454).

This is a division of application Ser. No. 158,575, filed June 11, 1980.

BACKGROUND OF THE INVENTION

In the past few decades our society's increasing demands for energy have naturally resulted in increased utilization of renewable reasources such as solar energy. One of the most common techniques of directly tapping solar energy involves the use of photovoltaic devices such as silicon solar cells. In general, solar cells are deployed in large solar arrays including numerous solar cells which are intricately positioned and interconnected to provide optimum electricity production.

A common problem in the use of solar cells is the requirement that they be protected from the terrestrial elements over a prolonged period of time. For example, in order to be commercially successful, solar arrays must be suitably encapsulated to achieve at least a 20-year lifetime expectancy in terrestrial environments. This has resulted in a concerted effort to develop a suitable encapsulating material to protect solar arrays from the elements over a sustained period of time.

Polymer films have been a natural choice as possible solar cell encapsulants. However, it has been a most difficult technical problem to develop proper polymers for encapsulating the solar cell arrays to protect the optically and electrically active elements from the degrading effects of typical terrestrial environments. In general, solar cell encapsulants have included three layers—the pottant, an adhesive and a weather resistant layer. The layer directly surrounding the solar cell is known as the pottant. The pottant insulates and protects the delicate mechanical and electrical elements of the solar cell against vibrations resulting from wind, earthquakes and other possible external forces. Ethylene vinyl acetate has found some success as a solar cell pottant, but it is many times difficult to apply.

The adhesive layer is necessary in order to secure the hard outer weather resistant layer to the relatively soft shock proof pottant layer. Many different adhesives, for example, silanes such as General Electric SS 4179 may be used for this purpose.

The weather resistant layer may be composed of different materials such as a hard acrylic polymer on the top and bottom surfaces and black or silicon rubber as a sealant along the edges. This layer functions to protect the solar cell from rain, dust and other debris.

In addition, technical problems in encapsulating solar cells are presented by the fact that it has long been desired to provide a method for directly encapsulating solar arrays at the final site. The encapsulation would be carried out after delivery and inspection of the numerous fragile electrical elements and interconnections and completion of testing to confirm that the electrical specifications have been met. Once it has been established that the solar array is in proper working order, the pottant medium is directly applied as a thin film over the solar cell array and further polymerized at the actual deployment site. The adhesive and hard outer coating are then applied. This severely limits the use of many polymers which are cast using environmentally undesirable solvents.

The likely candidates for solar cell pottants include silicones, fluorocarbons, and acrylic polymers. Acrylic polymers are preferred since they combine the essential factors of low cost, environmental resistance and general ease of processing.

Although acrylic polymers, in general, are preferred as solar cell pottants, the glass transition temperature for most acrylic polymers is too high, rendering them inappropriate for use in solar arrays subject to widely fluctuating temperatures. For example, below about 30° F., methyl acrylate becomes hard and may crack. However, n-butyl acrylate has a sufficiently low glass transition temperature to render it unaffected by temperature fluctuations usually experienced by solar cell arrays. In addition, linear uncrosslinked n-butyl acrylate is very tacky and functions well as an adhesive. This would remove the need for a separate adhesive as part of the solar cell encapsulant.

Even though n-butyl acrylate has been determined to have the best overall balance of properties for use as a solar cell pottant, it has not been possible to readily process the n-butyl acrylate to provide economically feasible methods for encapsulating solar cell arrays.

In studies on polymerization of n-butyl acrylate, it was found that bulk polymerization is not suitable, because it is difficult or impossible to control the molecular weight and thus to prevent cross-linking of the polymerized product. Highly crosslinked n-butyl acrylate would be much too hard for use as a pottant. Solution polymerization was found to give a polymer having an unacceptably low molecular weight. Emulsion polymerization was also found to be unsatisfactory because the polymer product was found to contain various impurities such as soap and catalyst fragments which interfere with the operation of the solar arrays and cause premature weathering of the encapsulant.

One promising method for applying n-butyl acrylate to solar arrays involves the preparation of an n-butyl acrylate polymer syrup solution containing a mixture of n-butyl acrylate monomer and poly(n-butyl) acrylate prepolymer. A polymer syrup solution of this type would be specifically useful for rapid formation of transparent films or sheets and as a pottant for solar cells and other delicate components without the use of high cost capital equipment, including such facilities as those currently required to provide for solvent recovery and minimization of atmospheric pollution.

The use of polymer syrups is well known in the preparation of methyl methacrylate where sheet casting results in a hard thin film. Polymer syrups of acrylates have not been used in sheet casting because of the highly unmanagable tacky film which would result.

In general, uncrosslinked acrylic polymers are soluble in their respective liquid monomers. Therefore, a syrup solution of monomer and polymer is prepared which when poured or otherwise applied to a surface results in polymerization of the remaining monomer to form the desired polymer film. The presence of the polymer helps to absorb heat generated during the polymerization of the monomer, thereby preventing undesirable crosslinking. This type of syrup solution would be ideal for field applications as a pottant to solar arrays and general application to any substrate requiring protection.

Although it is highly desirable to product such an n-butyl acrylate polymer syrup, attempts to produce such a syrup have not been successful. For example, attempts were made using methanol as a solvent in preparation of the poly(n-butyl)acrylate prepolymer; however, crosslinking of the prepolymer occurred resulting in low solubility in the n-butyl acrylate monomer. Other attempts using a methanol/water solvent for preparation of the poly(n-butyl) acrylate prepolymer prevented undesirable crosslinking of the prepolymer, but resulted in undesirably low overall yields of linear polymers.

SUMMARY OF THE INVENTION

In accordance with the present invention, a solar cell assembly is easily, efficiently and economically encapsulated with a polymer film that not only acts as a superior solar cell pottant, but remains tacky on its' outer surface so that a weather and dust resistant protective layer may be applied directly to the pottant without the need for adhesives.

The present invention is based on a polymer syrup solution of polyacrylate dissolved in acrylate monomer which can be easily and economically applied to a substrate to provide encapsulating insulation and protection.

Uncrosslinked poly acrylate is prepared by polymerization of the monomer in cyclohexane. The use of cyclohexane as a solvent produces high yields of appropriately sized (Mol. wt. 100,000 to 600,000) uncrosslinked poly(n-butyl)acrylate not available with prior art solvents. N-butyl acrylate monomer is then dissolved in the uncrosslinked polymer to form a polymer syrup solution which may be used immediately or stored under refrigeration for future use.

The polymer syrup solution may be polymerized (cured) by thermal heating or by use of a polymerization initiator. However, the use of polymerization initiators is preferred. In addition, polymerizable ultraviolet stabilizers may be included in the polymer syrup when the final cured polymer is to be subjected to continual solar radiation. Studies indicate that the ultraviolet stabilizers become part of the crosslinked network during curing.

The invention has particular application to encapsulating solar cell assemblies. A polymer syrup including from 40 to 70% by weight poly (n-butyl) acrylate and from 30 to 60% by weight n-butyl acrylate is especially useful as a solar cell pottant to encapsulate and protect delicate solar cell assemblies.

The polymer syrup is applied to solar cell assemblies by the simple method of submerging the cell assemblies in the polymer syrup. The polymer syrup may also be used in the fabrication of solar cell assemblies where the polymer syrup is used to bind solar cells to substrates and then used as a pottant to encapsulate the entire solar cell assembly.

The new polymer syrup is especially desirable for encapsulating arrays of solar cell assemblies at the solar collection site. Since application of the polymer syrup is conveniently accomplished by simply pouring it over the completely assembled solar cell array, it provides an efficient on site encapsulation method without the production of environmentally harmful solvent vapors and, as mentioned above, the poly (n-butyl) acrylate layer serves the dual purpose of pottant and adhesive.

These and many other features and attendant advantages of the present invention will become apparent as the invention becomes better understood by reference to the following detailed description when considered in conjunction with the accompanying drawings.

DETAILED DESCRIPTION OF THE INVENTION

Figure 1:
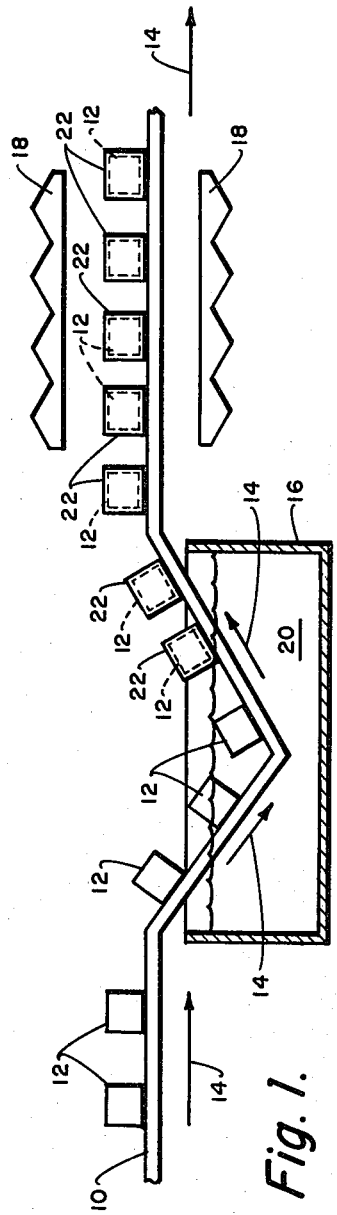
FIG. 1 is a diagrammatical representation of a preferred process for applying the polymer syrup of the present invention to desired objects.

A preferred polymer syrup of the present invention has the following general composition:

| | |
|---|---|
| poly(n-butyl)acrylate (PNBA) (mol.wt. 100,000–600,000) | 40–70 wt. % |
| n-butyl acrylate monomer (NBA) | 30–60 wt. % |
| Azoisobutyronitrile initiator (AIBN) | 0.05–1.0 wt. % |
| U.V. Stabilizer | 0–3.0 wt. % |

Preferably the polymer syrup will contain equal amounts of PNBA and NBA. The preferred ultra violet stabilizers (when used) are any of the vinyl salicylates or vinyl-2-hydroxybenzophenone. Although the present discussion is limited to n-butyl acrylate, it should be understood that the present invention is also applicable to other acrylates such as methyl acrylate and ethyl acrylate.

PREPARATION OF THE POLYMER SYRUP

The preparation of the polymer syrup involves two basic steps. First the poly(n-butyl) acrylate prepolymer is prepared. This is followed by addition of the prepolymer to n-butyl acrylate to form a polymer syrup solution which can then be stored for future application to solar arrays, etc.

In general, the prepolymer can be prepared by dissolving n-butyl acrylate monomer in a suitable solvent such as cyclo heptane or cyclohexane. Cyclohexane is preferred because it is readily available and inexpensive. To this reaction mixture is added a suitable polymerization initiator. The mixture is then stirred at room temperature to form a homogenous solution. The solution is then incubated at a slightly elevated temperature for an extended period of time to polymerize the n-butyl acrylate into a linear prepolymer. By using cyclohexane as a solvent, crosslinking of the poly(n-butyl)acrylate is eliminated. This is an important aspect of the present invention since, if crosslinking of the poly(n-butyl) acrylate occurs, the poly(n-butyl)acrylate will not be soluble in the acrylate monomer. The solvent is then separated from the resulting prepolymer by distillation.

The solvent free prepolymer is then dissolved in freshly distilled n-butyl acrylate monomer to form a polymer syrup. A polymerization initiator is then added to the polymer syrup, followed by refrigeration of the polymer syrup until future use. If desired, the polymerization initiator may be deteted and polymerization carried out thermally. However, thermal polymerization of the polymer syrup does not produce as desirable a polymer as does the polymerization by initiator.

An exemplary polymer syrup preparation follows:

1. To 100 grams of freshly distilled and degassed cyclohexane, 100 grams of distilled n-butyl acrylate were added. To the reaction mixture above, 0.01% of AIBN was added at room temperature; then the mixture was stirred under nitrogen until a homogeneous solution was obtained.

2. The solution was placed in a water bath at 80° C. for 15 hours under nitrogen with stirring.

3. The polymerization was stopped and the cyclohexane removed by distillation under reduced pressure at 50° C. Yield of polymer was 100 grams. The prepolymer has a peak MW of approximately 400,000 (GPC) and a 0.1% solution of the polymer in dichloromethane can be readily filtered through a filter with a pore size of 0.45 microns.

4. The polymer was then dissolved in 200 grams of freshly distilled monomer under nitrogen at room temperature, protected from light. After a homogeneous solution was obtained, 0.01% by weight of AIBN and 1% by weight of 5-vinyl, 2-hydroxy phenyl benzotriazole as a polymerizable U.V. stabilizer was added, and the mixture was stirred an additional 15 minutes and placed in a freezer at −20° C. for future use.

As previously mentioned, when other solvents such as methanol/$H_2O$ solvent are used in preparing the prepolymer; the resulting prepolymer yields are low (20% compared to 100% for cyclohexane) and the small amount of prepolymers formed have a low molecular weight.

PREPARATION OF POLY(N-BUTYL ACRYLATE FILM

Thin films of the polymer sryup were prepared in glass petri dishes which were placed in an oven at the temperatures indicated in the Table, with 2 psi of argon gas pressure. The polymer is obtained as a colorless transparent film free of any significant inclusions.

The percent conversion shown in the Table is based on the weight of the films after the end of the polymerization time. The percent loss of extraction was determined after the films were extracted for 24 hours in a Sohxlet extraction apparatus with dichloromethane as solvent.

To determine the length of flow path, the polymer films were kept in vacuum chamber for 24 hours at room temperature. Equal amounts of the polymer were then placed on the inside wall of glass test tubes (10×100 mm) and their positions marked.

The test tubes were placed in a vertical position in an oven at 90° C. and kept in the oven for 200 hours. Every 24 hours, the position of the polymer pieces was recorded. The numbers in the table indicate the final lengths of the flow paths after 200 hours at 90° C. No significant changes in the rates of flow were observed. The determinations were done in duplicate.

Glass transition temperature (Tg) was determined with a Dupont Thermoanalyzer M900. The differences in values of Tg are not significant and are attributed to difficulties in cutting samples of uniform thickness.

The gel permeation chromatography of the extracts was done with a Waters Associates Model 6000 gel permeation chromatograph, packed with a bank of four Styragel columns and standardized with commercial monodisperse polystyrene fractions. Column resolution limit is 867,000; therefore, $M_W$ values in excess of this are valid only for comparing this series of samples.

APPLICATION OF THE POLYMER SYRUP

FIG. 1 shows a method of encapsulation with the polymer syrup of the present invention by direct dipping or submerging of the substrate to be encapsulated into the polymer syrup and curing in a vacuum oven at moderate temperatures of about 80° C.

A suitable conveyor belt 10 is provided to continually transport the substrate from encapsulation to curing. As will be realized, any suitable substrate may be encapsulated with the polymer syrup of the present invention; however, the encapsulation of solar cells 12 is particularly contemplated. As indicated by arrow 14, the conveyor belt 10 is continually moved to transport the solar cells 12 into the syrup application vessel 16 and then to the vacuum oven represented diagrammatically at 18.

The polymer syrup of the present invention as described above is placed in the syrup application vessel 16 as shown at 20. The solar cells 12 are continually submerged into the polymer syrup 20 to apply the desired coating 22. Once the desired polymer syrup coating 22 has been applied to the solar cell 12, it is passed into the vacuum oven 18 where complete polymerization of the polymer syrup is accomplished.

Figure 3:
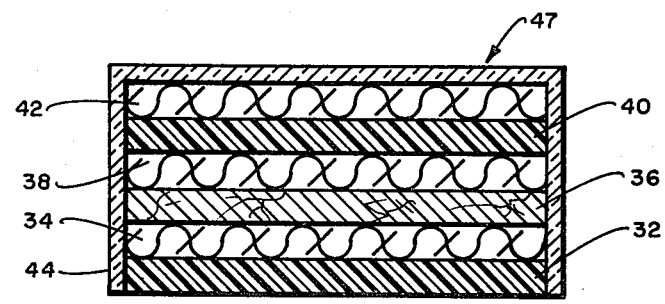
FIG. 3 is a preferred solar assembly encapsulated according to the method shown in FIG. 1.

FIG. 3 is a diagrammatic cross-section of a preferred solar cell encapsulated according to the process shown in FIG. 1. The solar cell is composed of six layers. The first layer 32 is a hard acrylic film such as cross-linked Korad. The second layer 34 is a glass cloth layer. The

| Lot Number | Polymerization Temp. | Polymerization Time (HRS) | % Conversion | % Loss on Extraction | Length of Flow Path in MM. | Tg | $M_N$ | $M_W$ | $\frac{M_W}{M_N}$ |
|---|---|---|---|---|---|---|---|---|---|
| 346-2-10K | 80° C. | 1.0 | 96.8 | 100.0 | ∞ | | 114,000 | 482,000 | 4.21 |
| 346-2-10L | 80° C. | 2.0 | 95.5 | 100.0 | 6 | | 182,000 | 962,000 | 5.27 |
| 346-2-10A | 80° C. | 4.0 | 97.5 | 32.06 | 0 | −58 | 398,000 | 1,034,000 | 2.6 |
| 346-2-10M | 80° C. | 6.0 | 96.5 | 34.50 | 2 | | 234,000 | 807,000 | 3.45 |
| 346-2-10B | 80° C. | 8.0 | 92.3 | 33.59 | 0 | −54 | 398,000 | 1,034,000 | 2.6 |
| 346-2-10C | 80° C. | 16.0 | 91.2 | 40.36 | 0 | −40 | 328,000 | 1,005,000 | 3.07 |
| 346-2-10D | 100° C. | 3.0 | 94.7 | 91.28 | 11 | −58 | 398,000 | 1,034,000 | 2.6 |
| 346-2-10E | 100° C. | 6.0 | 91.1 | 93.63 | 17 | −59 | 398,000 | 1,034,000 | 2.6 |
| 346-2-10F | 100° C. | 12.0 | 86.5 | 97.38 | 41 | −59 | 398,000 | 1,034,000 | 3.75 |
| 346-2-10G | 120° C. | 2.0 | 88.0 | 80.66 | 34 | −60 | 195,000 | 730,000 | 3.75 |
| 346-2-10H | 120° C. | 4.0 | 86.3 | 60.87 | 42 | −58 | 184,000 | 660,000 | 3.75 |
| 346-2-10I | 120° C. | 8.0 | 83.1 | 41.40 | 48 | −48 | 184,000 | 660,000 | 3.6 |
| 346-2-10O | 120° C. | 150.0 | 81.8 | 22.23 | 0 | −59 | 112,000 | 592,000 | 5.31 | third layer 36 is a wood substrate upon which is placed a fourth layer 38 which is also glass cloth. On top of these layers is placed the silicon solar cell 40. The solar cell 40 is a common photovoltaic solar cell including a silicon blank having a first layer of one conductivity and a second layer of opposed conductivity forming a junction diode. A first electrode (not shown) is provided across the rear surface of the cell and a second electrode (not shown) is placed on the front surface of the cell facing the sun. As is the usual practice, when solar radiation is absorbed by the cell 40, electron hole pairs are generated within the cell inducing a voltage between the first and second electrodes. It is preferred that the silicon solar cell 40 be of the square ribbon type; however silicon blanks having other configurations may be used equally as well. On top of the solar cell layer 40 is placed an additional glass cloth layer 42. This entire solar cell assembly is then submerged in the polymer syrup of the present invention as shown in the process of FIG. 1 to apply an encapsulating coating of poly (n-butyl) acrylate 44 to provide the encapsulated solar cell assembly shown generally at 47. The encapsulated assembly 47 is then covered with a final hard acrylic film (not shown), preferably containing UV stabilizers. This final covering serves to prevent deterioration of the solar cell and additionally provides a hard dust-resistant surface. The final covering may be commercial acrylic of the Korad-type, or other material with a $T_g$ greater than 90° C.

Figure 2:
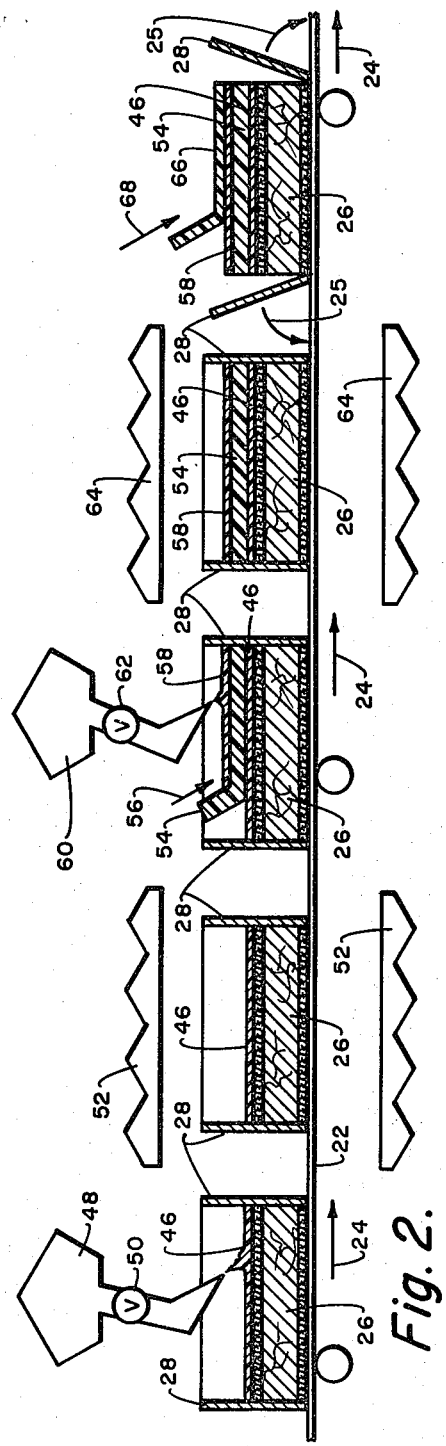
FIG. 2 is a diagrammatical representation of a method for producing encapsulated solar array assemblies using the polymer syrup of the present invention.

FIG. 2 shows a second process wherein multiple castings of the newly developed polymer syrup are carried out in production of a solar cell assembly. This second process, like the process described above, is a continuous process in which the solar cell assemblies are continuously moved through the process by conveyor belt 22. The direction of travel of the conveyor belt 22 is indicated by arrows 24. The process begins in the extreme left of FIG. 2 where a preferred substrate 26 (a layer of wood sandwiched between two glass cloth sheets) is placed on the conveyor belt 22. If desired, thin metal foil 28 or hard plastic such as Mylar of Korad is supplied along the edges of the substrate 26 to contain the polymer syrup when applied. Polymer syrup as described above is applied in a thin layer as shown at 46. The polymer syrup is kept in a first reservoir 48, with application of the syrup controlled by valve 50. Preferably, a whitening agent such as titanium oxide or magnesium oxide is added to the polymer syrup in reservoir 48. The substrate 26 having the polymer syrup layer 46 thereon is then passed into a first vacuum oven 52 where it is heated at a temperature of approximately 80° C. until the polymer syrup layer 46 becomes tacky. A silicon solar cell 54 is then placed on the tacky polymer syrup layer 46 as indicated by arrow 56. The silicon solar cell 54 can be of the type described previously in the process of FIG. 1. After the silicon solar cell 54 has been placed on the tacky of adhesive polymer syrup layer 46, a second layer of polymer syrup 58 is then applied over the silicon cell 54. The polymer syrup for the second polymer syrup layer 58 is kept in a second polymer syrup reservoir 60. The polymer syrup in reservoir 60 does not contain a whitening agent since this would reduce transmittance of light through the n-butyl acrylate polymer layer 58. The amount of polymer syrup which is applied to form layer 58 is controlled by valve 62.

Once the polymer syrup layer 58 has been applied, the solar cell assembly is then passed to a second vacuum oven 64 where final curing of the top polymer syrup layer is carried out at temperatures of about 80° C. The encapsulated assembly is then covered with a final hard acrylic film 66 as indicated by arrow 68. This final hard layer 66 may be of the same type as that previously described for providing weather and dust resistance for solar cells. This final hard acrylic film may also contain ultraviolet stabilizers if desired. The final covering 66 serves to prevent deterioration of the solar cell and additionally provides a hard dust-resistant surface. The metal film walls are then removed, as indicated by arrows 25. Finally, a non-tacky commercial sealant, such as silicon or black rubber is brushed over the sides and suitably cured to seal the solar cell assembly.

Figure 4:
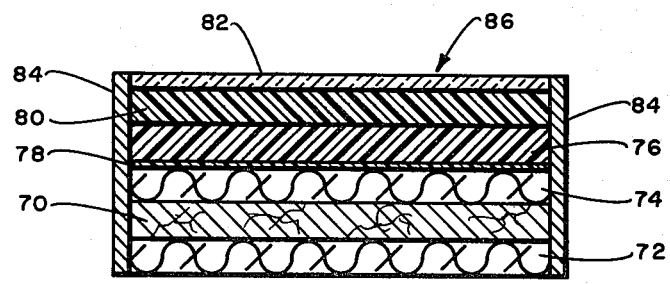
FIG. 4 is a preferred solar array assembly encapsulated according to the method of FIG. 2.

FIG. 4 is a diagrammatic representation of a preferred solar cell assembly prepared according to the method shown in FIG. 2.

The preferred solar cell substrate is a layer of wood 70 sandwiched between two layers of glass cloth 72 and 74. The solar cell 76 is bonded onto the glass cloth layer 74 by way of the tacky poly(n-butyl)acrylate adhesive layer 78. An encapsulating or pottant layer 80 of poly(n-butyl)acrylate is placed on top of the solar cell. The final weather resistant acrylic layer (Korad, Mylar, etc.) 82 is placed on and adhered to the tacky acrylate layer 80. Side sealant coatings 84 are provided for completing the entire weather resistant assembly shown generally at 86.

Having thus described preferred embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein.

What is claimed is:

1. An encapsulated solar cell assembly comprising:
   a substrate having an adhesive layer of poly (n-butyl) acrylate thereon;
   a solar cell assembly adhered on one side to said adhesive layer;
   an encapsulating layer of poly (n-butyl) acrylate on the other side of said solar cell assembly; and
   an outer weather resistant layer.

2. An assembly according to claim 1 wherein said poly (n-butyl) acrylate contains 1–5 weight percent of a polymerized ultraviolet stabilizer.

3. An assembly according to claim 2 wherein said ultraviolet stabilizer is poly (5-vinyl, 2-hydroxyphenyl benzotriazole.

* * * * *